United States Patent
Cao et al.

(10) Patent No.: US 8,957,664 B2
(45) Date of Patent: Feb. 17, 2015

(54) DEVICE AND METHOD FOR DETECTING CROWBAR CIRCUIT IN WIND TURBINE

(75) Inventors: Liang Cao, Shanghai (CN); Li Cai, Shanghai (CN); Yan-Song Lu, Shanghai (CN)

(73) Assignee: Delta Electronics (Shanghai) Co., Ltd., Shanghai (CN)

( * ) Notice: Subject to any disclaimer, the term of this patent is extended or adjusted under 35 U.S.C. 154(b) by 302 days.

(21) Appl. No.: 13/553,100

(22) Filed: Jul. 19, 2012

(65) Prior Publication Data

US 2013/0076336 A1    Mar. 28, 2013

(30) Foreign Application Priority Data

Sep. 23, 2011   (CN) .......................... 2011 1 0285663

(51) Int. Cl.
| | |
|---|---|
| *G01R 29/00* | (2006.01) |
| *H02H 9/00* | (2006.01) |
| *G01R 31/42* | (2006.01) |
| *G01R 31/24* | (2006.01) |
| *G05B 19/05* | (2006.01) |
| *H01H 47/00* | (2006.01) |

(52) U.S. Cl.
CPC ................ *G01R 31/42* (2013.01); *G01R 31/24* (2013.01); *G05B 19/054* (2013.01); *H01H 47/002* (2013.01)
USPC .............................................. 324/72; 361/54

(58) Field of Classification Search
CPC ...... G01R 31/24; G01R 31/42; G05B 19/054; H01H 47/002
USPC .............. 324/72, 500, 522, 537, 555, 713.01, 324/600, 602, 603, 605, 606, 629, 647, 656, 324/691, 705, 76.52, 76.77, 98; 702/57, 58, 702/64; 361/1, 54, 63, 65, 78, 86, 87, 88, 361/90, 91.1, 93.1

See application file for complete search history.

(56) References Cited

U.S. PATENT DOCUMENTS

| | | | | |
|---|---|---|---|---|
| 4,864,286 | A | * | 9/1989 | Ohshita et al. ................. 340/644 |
| 4,926,281 | A | | 5/1990 | Murphy |
| 5,144,517 | A | * | 9/1992 | Wieth .............................. 361/55 |
| 5,734,256 | A | * | 3/1998 | Larsen et al. ................. 323/207 |
| 6,236,546 | B1 | | 5/2001 | Blickhan et al. |

(Continued)

FOREIGN PATENT DOCUMENTS

| | | |
|---|---|---|
| JP | 2010213563 A | 9/2010 |
| TW | 201031817 A1 | 9/2010 |

*Primary Examiner* — Hoai-An D Nguyen
(74) *Attorney, Agent, or Firm* — CKC & Partners Co., Ltd.

(57) ABSTRACT

A device and a method for detecting a crowbar circuit in a wind turbine are provided, wherein the wind turbine comprises a converter electrically connected to the crowbar circuit, and the method comprises: electrically coupling a detection module to the crowbar circuit; inputting a first control signal into the crowbar circuit, to turn on the crowbar circuit; providing a three-phase voltage signal to the crowbar circuit via the converter, wherein voltage signals in any two adjacent phases has a predetermined phase angle difference; reading the first detection signal outputted by the detection module, to determine whether the crowbar circuit is normally thrown into the wind turbine; inputting a second control signal to the crowbar circuit, to turn off the crowbar circuit; and reading again the second detection signal outputted by the detection module, to determine whether the crowbar circuit is normally cut out from the wind turbine.

13 Claims, 10 Drawing Sheets

(56) References Cited

U.S. PATENT DOCUMENTS

| | | | |
|---|---|---|---|
| 8,154,833 B2* | 4/2012 | Ritter et al. | 361/54 |
| 8,451,573 B1* | 5/2013 | Klumper | 361/91.1 |
| 2007/0279815 A1* | 12/2007 | Li et al. | 361/54 |
| 2008/0154523 A1* | 6/2008 | Gilbert et al. | 702/62 |
| 2010/0102762 A1* | 4/2010 | Sugimoto et al. | 318/376 |
| 2010/0134935 A1* | 6/2010 | Ritter et al. | 361/55 |
| 2010/0201330 A1* | 8/2010 | Ichinose et al. | 322/61 |
| 2010/0235119 A1* | 9/2010 | Garcia | 702/59 |
| 2010/0327599 A1* | 12/2010 | Nielsen et al. | 290/55 |
| 2011/0118883 A1* | 5/2011 | Kirchner et al. | 700/287 |
| 2012/0249151 A1* | 10/2012 | Dobusch et al. | 324/424 |

* cited by examiner

DEVICE AND METHOD FOR DETECTING CROWBAR CIRCUIT IN WIND TURBINE

RELATED APPLICATIONS

This application claims priority to Chinese Application Serial Number 201110285663.9, filed Sep. 23, 2011, which is herein incorporated by reference by its entirety.

BACKGROUND

1. Field of Invention

The present invention relates to the field of wind power generation. More particularly, the present invention relates to a device for detecting a crowbar circuit in the wind turbine and the method thereof.

2. Description of Related Art

With the increasing energy crisis and environmental issues, countries all over the world are vigorously developing renewable energy businesses, such as wind power generation and solar energy generation. Taking the wind power generation as an example, the installed wind power capacity in China grows rapidly, which is developed from a stall-regulated wind power system to a variable-speed and constant-frequency (VSCF) wind power system, and from a wind power system with a gear case to a direct-drive wind power system without the gear case.

However, with continuously increasing of the installed wind power capacity, after grid-connected power generation is implemented, the influence of the increased installed wind power capacity on the electrical grid cannot be simply ignored any more. For example, in order to deal with the impact of the wind turbine on the electrical grid, many countries in Europe have established new rules setting new requirements on the grid-connected wind power generation, such as controls on active power and reactive power, controls on voltage and frequency, controls on electric power quality and a low voltage ride-through function. If the grid-connected wind turbine meets these requirements, then even if the electrical grid fails (such as, voltage drops), the grid-connected wind turbine still can function without interruption, so as to provide active power and reactive power to the electrical grid rapidly, and thus the voltage and frequency of the electrical grid can be recovered and become stable timely.

Taking the direct-drive wind power system as an example, when a voltage of the electrical grid drops and the outputted voltage decreases, the outputted current has to be increased, so as to keep a balance between the power absorbed from the blower through the converter and the power transferred to the electrical grid through the converter. In general, the main circuit of the converter is often formed from a power semiconductor device such as an insulated gate bipolar transistors (IGBT) of which the thermal capacity is limited, and thus the current has to be limited. Specifically, when the dropping margin of the voltage of the electrical grid is larger, the inputted power and the outputted power of the converter are not balanced. That is, the power received from the blower through the converter is not balanced with the power transferred to the electrical grid through the converter. A common solution for the aforementioned problem includes: decreasing the power inputted by the blower; or adding a crowbar circuit for absorbing excess energy, so as to improve the short-time overload capacity of the converter at an electric machine side. When the failure is fixed and the system is recovered to be normal, the crowbar circuit is cut out from the system, thereby effectively protecting the converter.

It can be known from the above descriptions that when the power inputted into the converter from the blower is higher than that transferred to the electrical grid through the converter, a crowbar circuit can be used to absorb excess energy. However, once the crowbar circuit fails, if the system does need to throw the crowbar circuit into the system but the crowbar circuit cannot operate normally, a fatal impact on the converter will be caused, which may even cause converter scrap in a serious case.

In view of this, it is a problem desired to be solved by this industry regarding how to design a technical solution which may detect whether the crowbar circuit is normally thrown into or cut out from the wind turbine, so that an operator can locate the failure timely and precisely.

SUMMARY

The present invention aims to provide a detection device for detecting a crowbar circuit in a wind turbine and the method thereof, as well as a wind power facility including the detection device.

In order to achieve the above-mentioned object, a technical aspect of the present invention relates to a method for detecting a crowbar circuit in the wind turbine. The wind turbine includes a converter electrically connected to the crowbar circuit. In this method, firstly, a detection module is electrically coupled to the crowbar circuit. Then, a first control signal is inputted into the crowbar circuit, so as to turn on the crowbar circuit. Subsequently, a three-phase voltage signal is provided to the crowbar circuit via the converter, and voltage signals of the three-phase voltage in any two adjacent phases has a predetermined phase angle difference. A first detection signal outputted by the detection module is read, so as to determine whether the crowbar circuit is thrown into the wind turbine. Then, a second control signal is inputted into the crowbar circuit, so as to turn off the crowbar circuit. Thereafter, a second detection signal outputted by the detection module is read again, so as to determine whether the crowbar circuit is cut out from the wind turbine.

In a specific embodiment, the detection module is a current sensor, and the current sensor is connected with the crowbar circuit in series. In another specific embodiment, the detection module is a voltage sensor, and the voltage sensor is connected with the crowbar circuit in parallel.

In a specific embodiment, the method further includes: receiving a first detection signal and a second detection signal; and according to the received first and second detection signals, outputting an alarm signal when the crowbar circuit is thrown into or cut out from the wind turbine abnormally.

In a specific embodiment, in the three-phase voltage signal, any voltage signal in the adjacent phases has a phase angle difference of 120 degrees. The duration of the first control signal is not shorter than the duration corresponding to the period from the starting time of the first voltage signal to the ending time of the second voltage signal in the three-phase voltage signal. The first voltage signal has the smallest phase angle and the second voltage signal has the largest phase angle.

A technical aspect of the present invention relates to a detection device for detecting a crowbar circuit in a wind turbine. The wind turbine includes a converter electrically connected to the crowbar circuit. The detection device includes a detection module, a control module and an alarm module. The detection module is electrically connected to the crowbar circuit for outputting a detection signal. The control module is electrically connected to the crowbar circuit for outputting a first control signal and a second control signal.

The first control signal is used for turning on the crowbar circuit and the second control signal is used for turning off the crowbar circuit. The alarm module is electrically connected to the detection module for receiving the detection signal and determining whether the crowbar circuit operates normally according to the detection signal. The detection signal includes a first detection signal and a second detection signal. When the control module outputs the first control signal, the first detection signal is used for detecting whether the crowbar circuit is normally thrown into the wind turbine; and when the control module outputs the second control signal, the second detection signal is used for detecting whether the crowbar circuit is normally cut out from the wind turbine.

In a specific embodiment, the detection module is a current sensor, and the current sensor is connected with the crowbar circuit in series.

In another specific embodiment, the detection module is a voltage sensor, and the voltage sensor is connected with the crowbar circuit in parallel.

In a further specific embodiment, the duration of the first control signal is not shorter than the duration corresponding to the period from the starting time of the first voltage signal to the ending time of the second voltage signal in the three-phase voltage signal. The first voltage signal has the smallest phase angle and the second voltage signal has the largest phase angle.

A technical aspect of the present invention relates to a wind power facility including a blower and a converter. The converter includes a first transducer at the blower side. The wind power facility further includes:

a crowbar circuit electrically connected to the blower and the first transducer, wherein when the power received from the blower via the converter is higher than the power outputted to the electrical grid via the converter, the crowbar circuit absorbs excess power from the blower; and a detection device electrically connected to the crowbar circuit, wherein the detection device is the detection device according to another aspect of the present invention.

BRIEF DESCRIPTION OF THE DRAWINGS

After reading specific embodiments of the present invention with reference to the accompanying drawings, readers can understand various aspects of the present invention more clearly. In the drawings.

DETAILED DESCRIPTION

Figure 1:
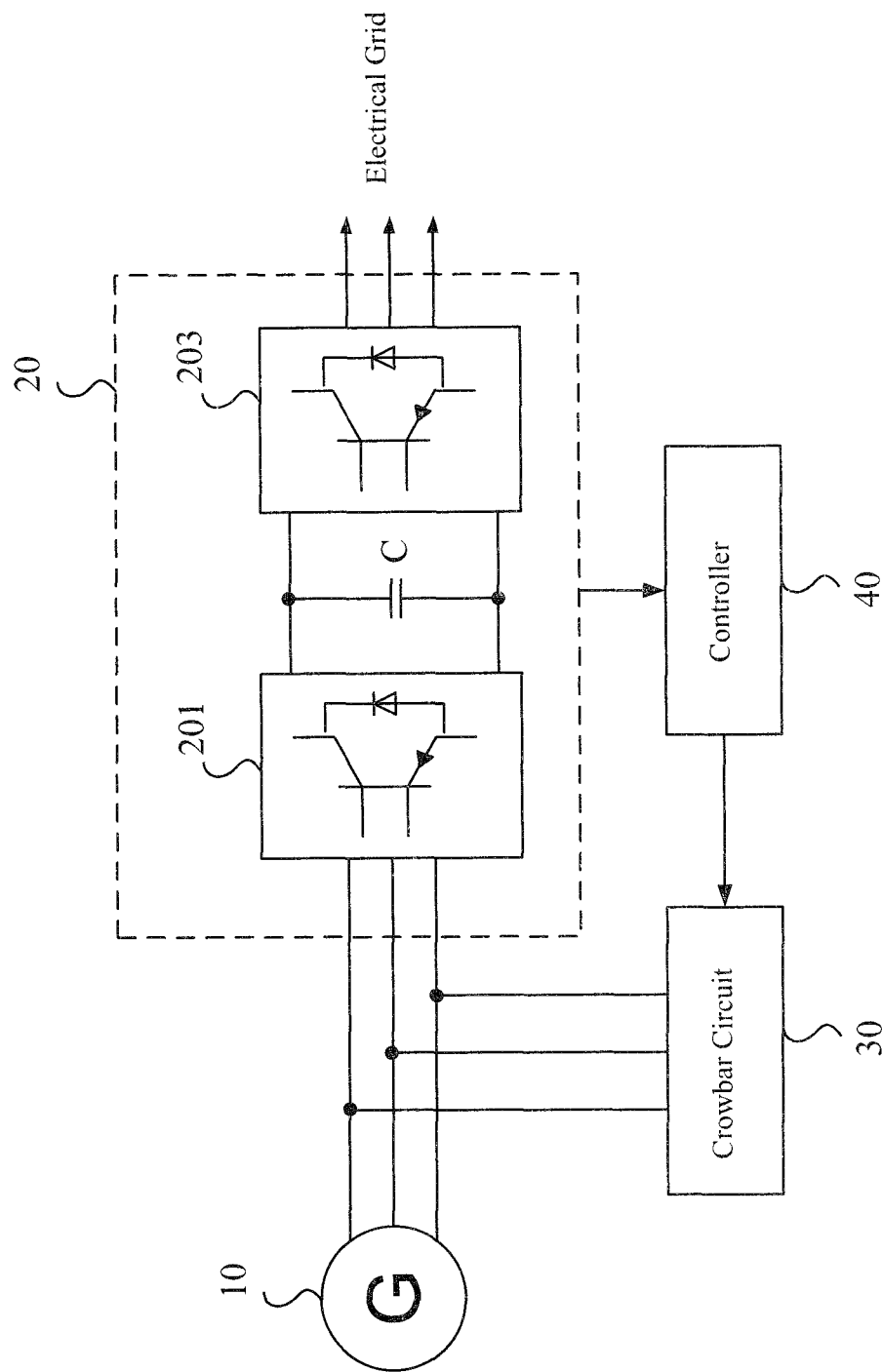
FIG. 1 illustrates a circuit schematic diagram of a crowbar circuit for absorbing excess power from the blower in the wind turbine.

Specific embodiments of the present invention are further described in details below with reference to the accompanying drawings.

In order to make the technical contents of the present invention more detailed and more comprehensive, various embodiments of the present invention are described below with reference to the accompanying drawings. The same reference numbers are used in the drawings to refer to the same or like elements. However, the embodiments described herein do not intend to limit the present invention, and the description of structure operation does not intend to limit its implementation order. Any device with equivalent functions that is produced from a structure formed from recombination of elements shall fall within the scope of the present invention.

Moreover, the drawings are merely illustrative and are not drawn to the original size. On the other hand, well-known elements and steps are not described in the embodiments to avoid causing unnecessary limitations to the present invention.

FIG. 1 illustrates a circuit schematic diagram of a crowbar circuit for absorbing excess power from a blower in a wind turbine. Referring to FIG. 1, the wind turbine includes a blower 10, a converter 20, a crowbar circuit 30 and a controller 40. The converter 20 includes a transducer 201 near the side of the blower 10, a DC capacitor C and a transducer 203 near the side of the electrical grid. Specifically, when the voltage of an electrical grid is normal, the blower converts wind power into electric power, and the electric power is transferred to the electrical grid via the converter 20. At this time, the inputted power received from the blower 10 via the converter 20 and the outputted power transferred to the electrical grid via the converter 20 are balanced. The controller 40 receives an indication signal representing a balance between the inputted power of the converter 20 and the outputted power of the converter 20. Thus, the crowbar circuit 30 does not need to be thrown into the wind turbine. However, when the voltage of the electrical grid drops, the outputted power transferred to the electrical grid via the converter 20 is not balanced with the inputted power received from the blower via the converter 20. More specifically, since the voltage of the electrical grid drops, the power received by the electrical grid from the converter 20 is lower than the power inputted into the converter 20 from the blower 10, thus resulting in an unbalance between the inputted power and outputted power of the converter 20. The controller 40 receives an indication signal representing the unbalance and sends a control signal to the crowbar circuit 30, such that the crowbar circuit 30 is thrown into the wind turbine and absorbs the difference between the inputted power and the outputted power of the converter 20, i.e. the excess power, thereby protecting the converter 20 from being damaged while ensuring that the wind turbine is not disconnected from the grid. When the failure of the voltage of the electrical grid is fixed, the balance between the inputted power and the outputted power of the converter 20 is recovered, and the controller 40 sends a control signal to the crowbar circuit 30, such that the crowbar circuit 30 is cut out from the wind turbine.

Figure 2:
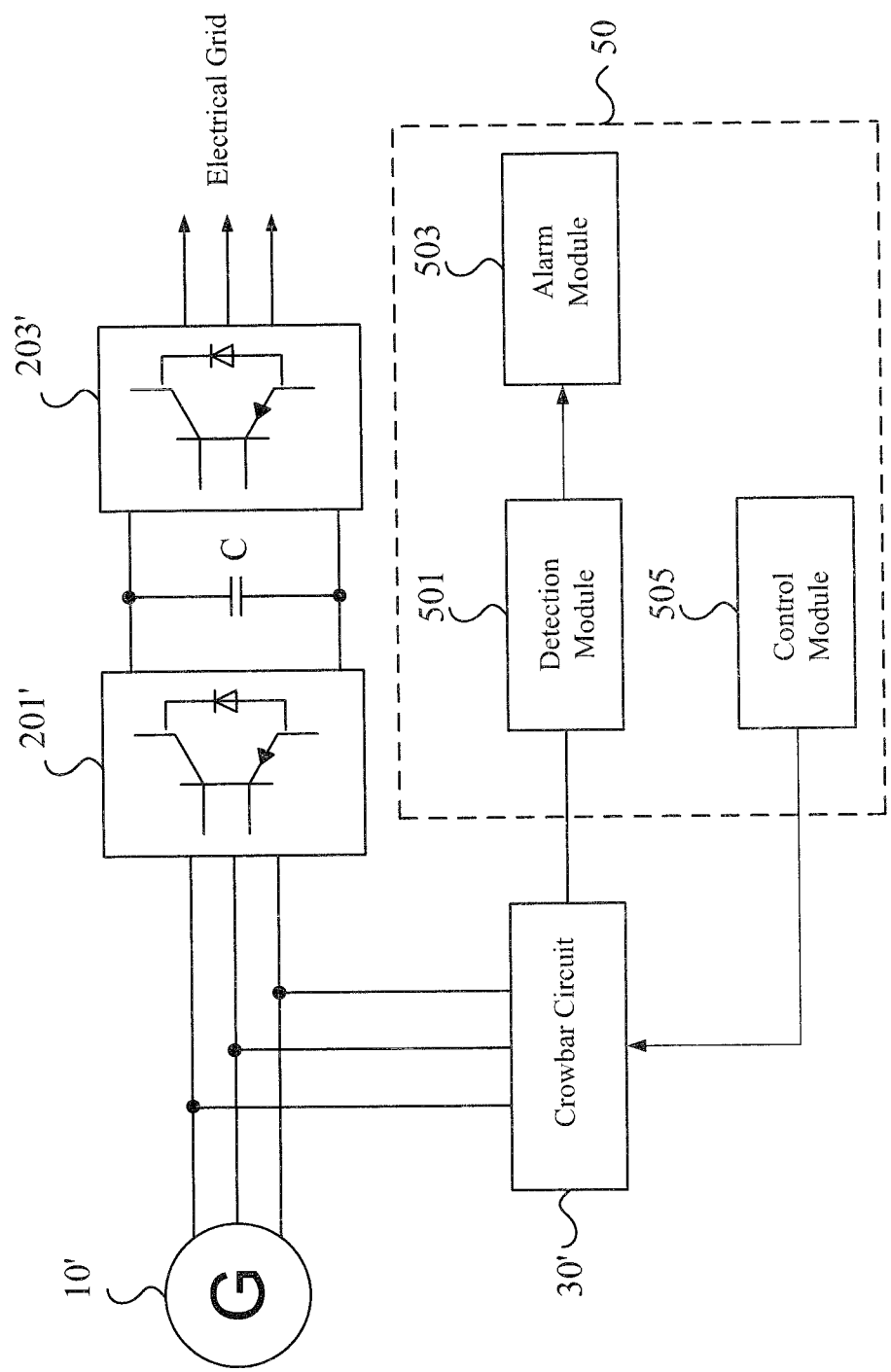
FIG. 2 illustrates a structure block diagram of a detection device for detecting the crowbar circuit in the wind turbine according to an aspect of the present invention.

FIG. 2 illustrates a structure block diagram of a detection device for detecting the crowbar circuit in the wind turbine according to an aspect of the present invention. Compared with FIG. 1, a blower 10', a converter including a blower-side transducer 201' and an electrical-grid-side transducer 203', and a crowbar circuit 30' are respectively the same as or similar to the blower 10, converter 20 and crowbar circuit 30 shown in FIG. 1, and for sake of simplicity, no further description will be stated herein. They are incorporated herein by reference.

Referring to FIG. 2, the wind turbine further includes a detection device 50 electrically connected to the crowbar circuit 30' for detecting whether the crowbar circuit 30' is normally thrown into the wind turbine or normally cut out from the wind turbine. Specifically, the detection device 50 includes a detection module 501, an alarm module 503 and a control module 505. The detection module 501 is electrically connected to the crowbar circuit 30' for outputting a detection signal. The control module 505 is electrically connected to the crowbar circuit 30' for outputting different control signals, to turn on or turn off the crowbar circuit 30'. The alarm module 503 is electrically connected to the detection module 501 for receiving the detection signal outputted by the detection module 501 and then determining whether the crowbar circuit 30' operates normally according to the detection signal.

In a specific embodiment, the control signal outputted by the control module 505 includes a first control signal (also called a turn-on signal) and a second control signal (also called a turn-off signal). The first control signal is used for turning on the crowbar circuit 30' and the second control signal is used for turning off the crowbar circuit 30'. Correspondingly, the detection signal outputted by the detection module 501 includes a first detection signal and a second detection signal. When the control module 505 outputs the first control signal, the first detection signal is used for detecting whether the crowbar circuit 30' is normally thrown into the wind turbine; and when the control module 505 outputs the second control signal, the second detection signal is used for detecting whether the crowbar circuit 30' is normally cut out from the wind turbine.

In another specific embodiment, the detection device 50 is suitable for detecting the crowbar circuit 30' when the converter in the wind turbine is cold booted. Thus, when the converter is cold booted, it may be predetermined whether the crowbar circuit 30' can be normally thrown into the wind turbine and normally cut out from the wind turbine through the different detection signals outputted by the detection device 50, so as to rapidly determine whether the performance and quality of the crowbar circuit 30' meet requirements for being thrown into and being cut out from the wind turbine, thereby not only facilitating an operator to remove the failure timely and precisely, but also minimizing the potential damage to the converter due to the crowbar circuit, thus effectively protecting core elements of the wind power system.

In another specific embodiment, when whether the crowbar circuit 30' can be normally thrown into the wind turbine is detected, the detection device 50 further includes a providing module (not shown) for providing the three-phase voltage signal from the converter to the crowbar circuit 30'. For example, the converter provides three-phase voltages V1, V2 and V3 to the crowbar circuit 30', which are respectively corresponding to the A-phase output terminal, the B-phase output terminal and the C-phase output terminal of the blower 10'. Whether the crowbar circuit 30' can be normally thrown into or cut out from the wind turbine is determined by detecting the electric signal (such as a current signal or a voltage signal) loaded on the crowbar circuit 30' at this time.

Figure 3:
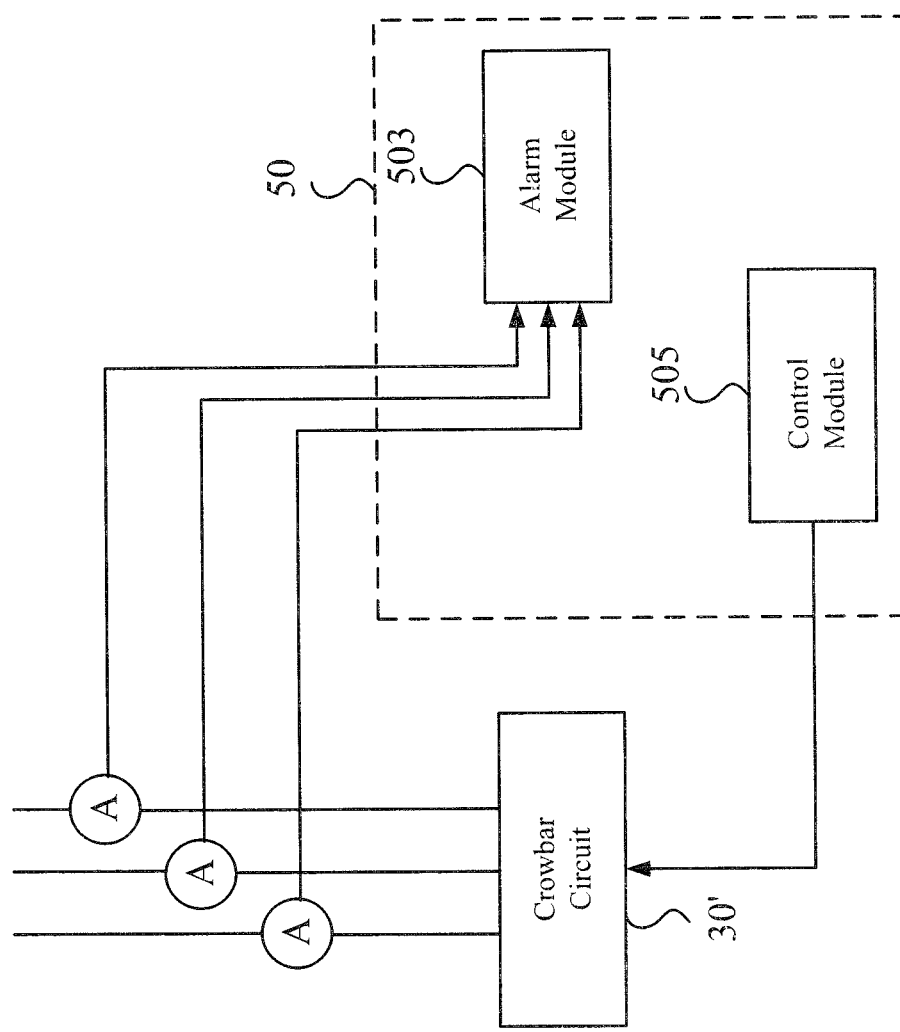
FIG. 3 illustrates a first preferred embodiment in which the detection device of FIG. 2 is electrically connected to the crowbar circuit.
Figure 4:
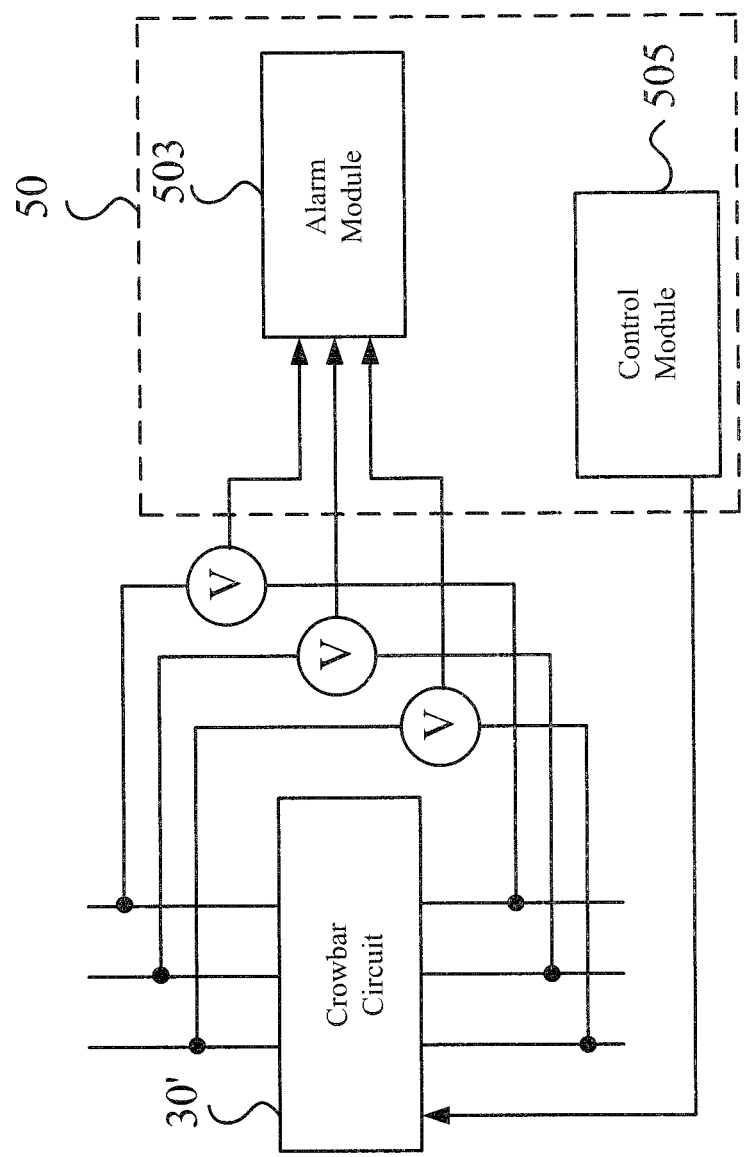
FIG. 4 illustrates a second preferred embodiment in which the detection device of FIG. 2 is electrically connected to the crowbar circuit.

FIG. 3 illustrates a first preferred embodiment in which the detection device of FIG. 2 is electrically connected to the crowbar circuit; and FIG. 4 illustrates a second preferred embodiment in which the detection device of FIG. 2 is electrically connected to the crowbar circuit.

Referring to FIG. 3, the detection module 501 of the detection device 50 is a current sensor. The three current sensors are respectively corresponding to the three-phase branches arranged in the crowbar circuit 30', and each current sensor is connected with the crowbar circuit 30' in series, so as to detect whether the current passes through the crowbar circuit 30'. When the converter provides a three-phase voltage signal to the crowbar circuit, and the control module 505 provides a first control signal to the crowbar circuit, the crowbar circuit is turned on. At this time, whether the current sensor has a current signal is detected, and whether the crowbar circuit is normally thrown into the wind turbine is determined according to the current signal inputted to the alarm module 503. For example, when a current signal is detected, it represents that the crowbar circuit is normally thrown into the wind turbine, and thus alarming is not required; and when no current signal is detected, it represents that the crowbar circuit is abnormally thrown into the wind turbine, and thus a voice signal or a photoelectric signal is sent. On the other hand, when the converter continues to provide the three-phase voltage signal to the crowbar circuit, and the control module 505 provides the second control signal to the crowbar circuit, the crowbar circuit is turned off. At this time, whether the current sensor has a current signal is detected, and whether the crowbar circuit is normally cut out from the wind turbine is determined according to the current signal inputted to the alarm module 503. For example, when a current signal is detected, it represents that the crowbar circuit is abnormally cut out from the wind turbine, and a voice signal or a photoelectric signal is sent; and when no current signal is detected, it represents that the crowbar circuit is normally cut out from the wind turbine and alarming is not required.

Similarly, referring to FIG. 4, the detection module 501 of the detection device 50 is a voltage sensor. The three voltage sensors are respectively corresponding to the three-phase branches arranged in the crowbar circuit 30', and each voltage sensor is connected with the crowbar circuit 30' in parallel, so as to detect the voltage loaded on the crowbar circuit 30'. When the converter provides the three-phase voltage signal to the crowbar circuit, and the control module 505 provides the first control signal to the crowbar circuit, the crowbar circuit is turned on. At this time, the voltage signal of the voltage sensor is detected, and whether the crowbar circuit is normally thrown into the wind turbine is determined according to the voltage signal inputted to the alarm module 503. For example, when the voltage of an energy-consuming resistance (also called an absorption resistance, a contact resistance, a load resistance or a braking resistance) loaded on the crowbar circuit 30' is not zero, it represents that the crowbar circuit is normally thrown into the wind turbine, and thus alarming is not required; and when the voltage is zero, it represents that the crowbar circuit is abnormally thrown into the wind turbine, and thus a voice signal or a photoelectric signal is sent. On the other hand, when the converter continues to provide the three-phase voltage signal to the crowbar circuit, and the control module 505 provides the second control signal to the crowbar circuit, the crowbar circuit is turned off. At this time, the voltage signal of the voltage sensor is detected, and whether the crowbar circuit is normally cut out from the wind turbine is determined according to the voltage signal inputted to the alarm module 503. For example, when the voltage of an energy-consuming resistance (also called an absorption resistance, a contact resistance, a load resistance or a braking resistance) loaded on the crowbar circuit 30' is not zero, it represents that the crowbar circuit is abnormally cut out from the wind turbine, and thus a voice signal or a photoelectric signal is sent; and when the voltage is zero, it represents that the crowbar circuit is normally cut out from the wind turbine, and thus alarming is not required.

FIGS. 5-8 schematically illustrate first to fourth specific embodiments of the crowbar circuit detected by the detection device of FIG. 2 respectively.

Figure 5:
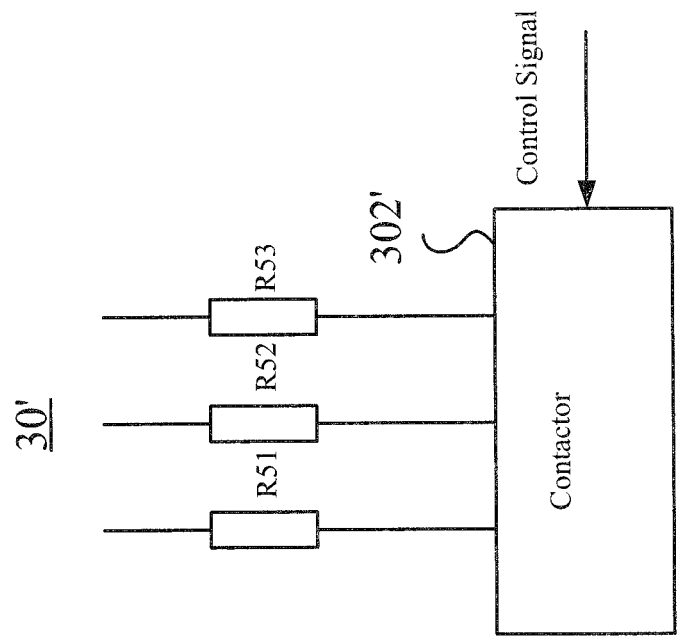
FIG. 5 schematically illustrates a first specific embodiment of the crowbar circuit detected by the detection device of FIG. 2.

In FIG. 5, the crowbar circuit 30' includes a contactor 302' and three absorption resistances R51, R52 and R53. The absorption resistances are connected to the contactor 302' in parallel. Then, the contactor 302' is electrically turned on or off according to the control signal from the control module 505, thereby determining whether the crowbar circuit 30' can be normally thrown into the wind turbine or normally cut out from the wind turbine.

Figure 6:
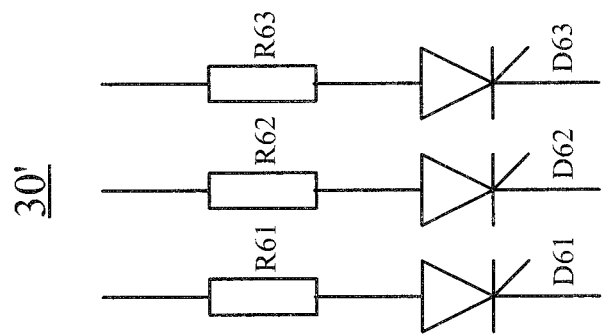
FIG. 6 schematically illustrates a second specific embodiment of the crowbar circuit detected by the detection device of FIG. 2.

In FIG. 6, the crowbar circuit 30' includes three branches connected in parallel, and each branch is formed by a contact resistance R61 (R62/R63) and a thyristor D61 (D62/D63) connected in series. The thyristor D61 is electrically turned on or off according to the control signal from the control module 505, thereby determining whether the crowbar circuit 30' can be normally thrown into the wind turbine or normally cut out from the wind turbine.

Figure 7:
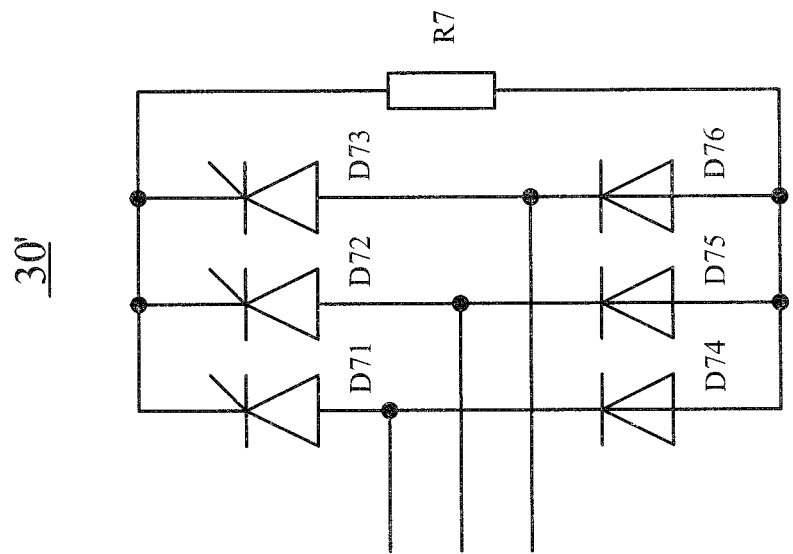
FIG. 7 schematically illustrates a third specific embodiment of the crowbar circuit detected by the detection device of FIG. 2.

In FIG. 7, the crowbar circuit 30' includes three first bridge arms and a load resistance R7 connected in parallel. The first bridge arm is formed from a power switch D71 (D72/D73) and a diode D74 (D75/D76) connected in series. The power switch D71 is electrically turned on or off according to the control signal from the control module 505, thereby determining whether the crowbar circuit 30' can be normally thrown into the wind turbine or normally cut out from the wind turbine.

Figure 8:
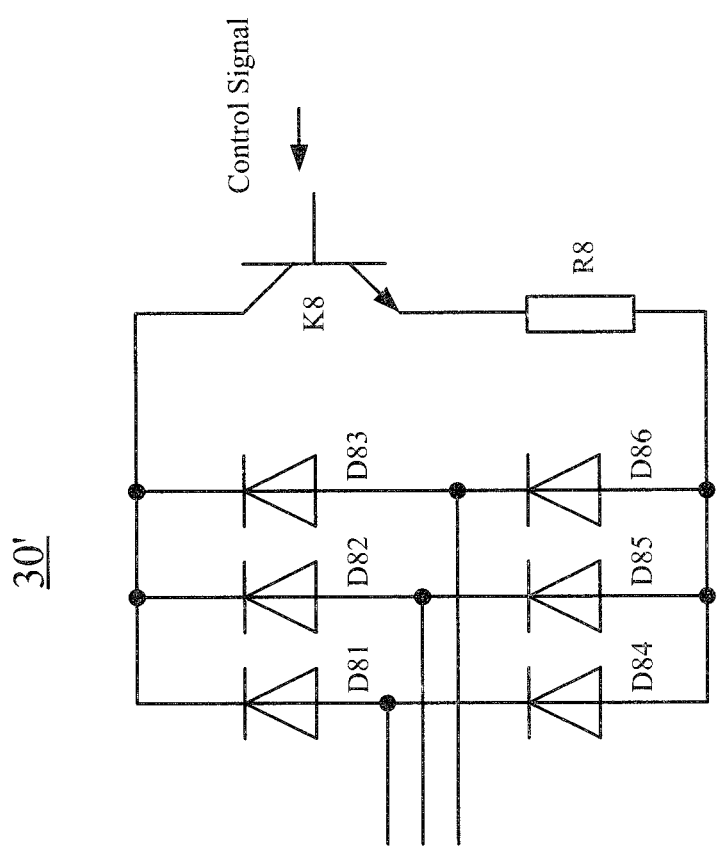
FIG. 8 schematically illustrates a fourth specific embodiment of the crowbar circuit detected by the detection device of FIG. 2.

In FIG. 8, the crowbar circuit 30' includes three second bridge arms and a control branch connected in parallel. The second bridge arm is formed from two diodes D81 and D84 (D82 and D85, D83 and D86) connected in series. The control branch is formed from an IGBT K8 and a braking resistance R8 connected in series. The IGBT K8 is electrically turned on or off according to the control signal from the control module 505, thereby determining whether the crowbar circuit 30' can be normally thrown into the wind turbine or normally cut out from the wind turbine.

Figure 9:
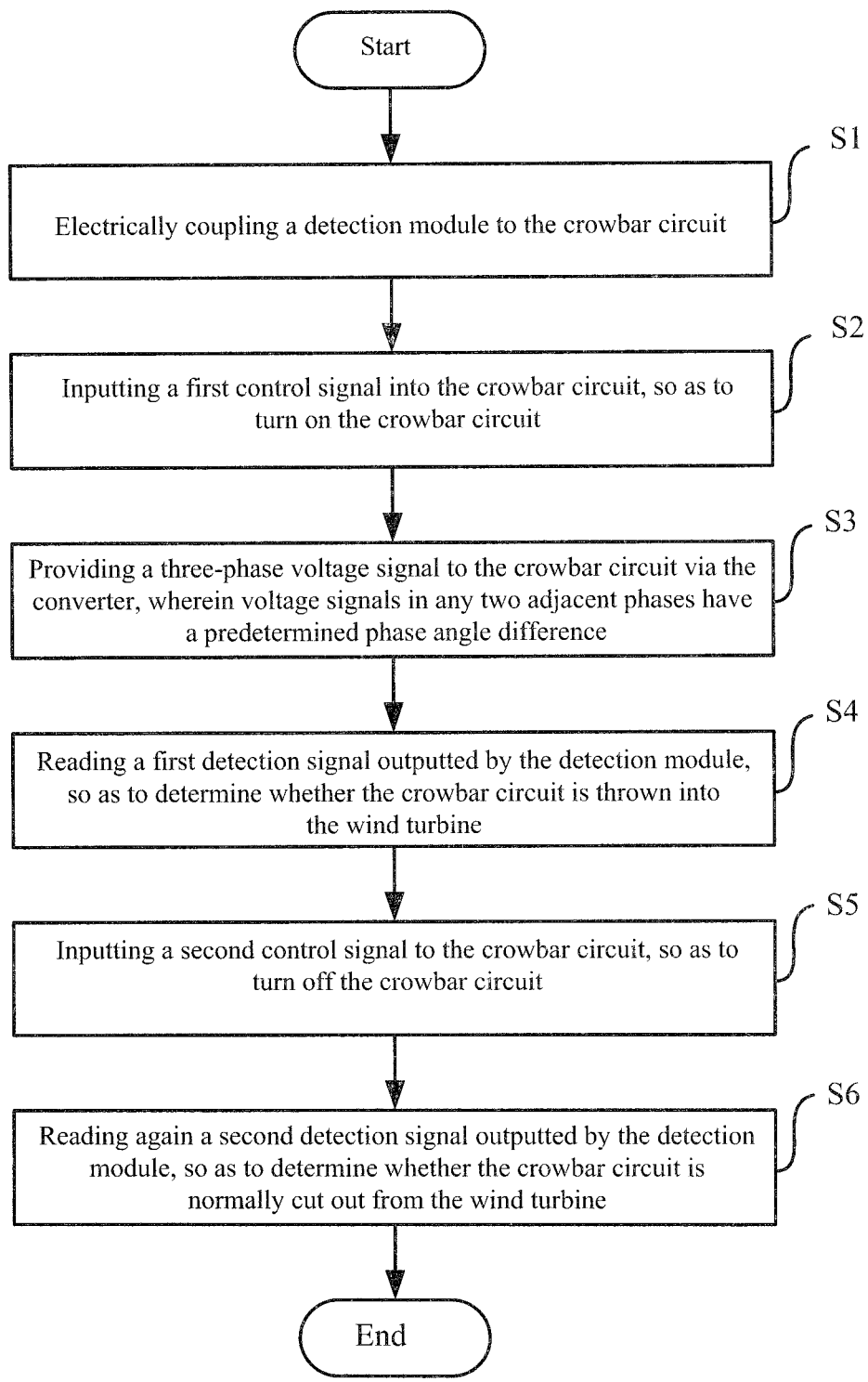
FIG. 9 illustrates a flowchart of a method for detecting the crowbar circuit in the wind turbine according to another aspect of the present invention.

FIG. 9 illustrates a flowchart of a method for detecting the crowbar circuit in the wind turbine according to another aspect of the present invention. The wind turbine includes a converter electrically connected to the crowbar circuit. Referring to FIG. 9, the detection method includes: performing step S1 for electrically coupling a detection module to the crowbar circuit. For example, when the detection module is a current sensor, the current sensor is connected to the crowbar circuit in series; and when the detection module is a voltage sensor, the voltage sensor is connected to the crowbar circuit in parallel. Then, step S2 is performed for inputting a first control signal into the crowbar circuit, so as to turn on the crowbar circuit. Subsequently, step S3 is performed for providing a three-phase voltage signal to the crowbar circuit via the converter, wherein voltage signals in any two adjacent phases has a predetermined phase angle difference. For example, for a three-phase blower, the predetermined phase angle difference of the voltage signal in the adjacent phases may be set to 120 degrees. Then, step S4 is performed for reading a first detection signal outputted by the detection module, so as to determine whether the crowbar circuit is thrown into the wind turbine. For example, when the detection module is a current sensor, if a current signal is detected, it represents that the crowbar circuit is normally thrown into the wind turbine, and thus alarming is not required; and if no current signal is detected, it represents that the crowbar circuit is abnormally thrown into the wind turbine, and thus a voice signal or a photoelectric signal is sent. Subsequently, step S5 is performed for inputting a second control signal to the crowbar circuit, so as to turn off the crowbar circuit. Thereafter, step S6 is performed for reading again a second detection signal outputted by the detection module, so as to determine whether the crowbar circuit is normally cut out from the wind turbine. For example, when the detection module is a current sensor, if a current signal is detected, it represents that the crowbar circuit is abnormally cut out from the wind turbine, and thus a voice signal or a photoelectric signal is sent; and if no current signal is detected, it represents that the crowbar circuit is normally cut out from the wind turbine, and thus alarming is not required.

In a specific embodiment, the wind turbine is a direct-drive permanent-magnet variable-speed and constant-frequency wind turbine or a doubly-fed variable-speed and constant-frequency wind turbine.

In another specific embodiment, the duration of the first control signal for turning on the crowbar circuit is not shorter than a period from a starting time of the first voltage signal to an ending time of the second voltage signal in the three-phase voltage signal. The first voltage signal has the smallest phase angle and the second voltage signal has the largest phase angle.

Figure 10:
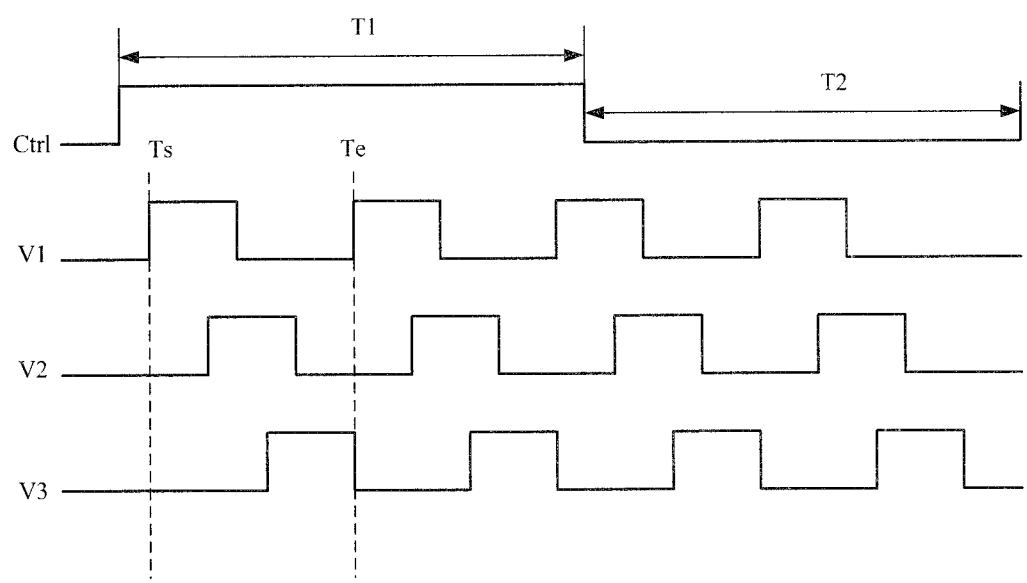
FIG. 10 illustrates a timing diagram of providing the control signal and the three-phase voltage signal in the detection method of FIG. 9.

FIG. 10 illustrates a timing diagram of providing the control signal and the three-phase voltage signal in the detection method of FIG. 9. Referring to FIG. 10, Ctrl represents the control signal outputted by the control module; and V1, V2 and V3 respectively represent the three-phase voltage signal provided by the converter to the crowbar circuit. More specifically, Ctrl includes the first control signal outputted during the time period T1 and the second control signal outputted during the time period T2. The first control signal is used for turning on the crowbar circuit, and the second control signal is used for turning off the crowbar circuit. Moreover, the voltage waveforms among the three-phase voltage signals V1, V2 and V3 are spaced at a predetermined time delay. That is, each of the voltage signals V1, V2 and V3 has a predetermined phase angle difference.

In a specific embodiment, when the control module outputs a first control signal to turn on the crowbar circuit, the converter provides the three-phase voltage signal to the crowbar circuit. Then, whether the crowbar circuit is normally thrown into the wind turbine is determined through the first detection signal outputted by the detection module. For example, when the detection module is a current sensor, if a current signal is detected, it represents that the crowbar circuit is normally thrown into the wind turbine; and if no current signal is detected, it represents that the crowbar circuit is abnormally thrown into the wind turbine, and a voice signal or a photoelectric signal is sent. Subsequently, when the control module outputs a second control signal to turn off the crowbar circuit, the converter continuously provides the three-phase voltage signal to the crowbar circuit. Then, whether the crowbar circuit is normally cut out from the wind turbine is determined through the second detection signal outputted by the detection module. For example, when the detection module is a current sensor, if a current signal is detected, it represents that the crowbar circuit is abnormally cut out from the wind turbine; and if no current signal is detected, it represents that the crowbar circuit is normally cut out from the wind turbine.

Preferably, the duration T1 of the first control signal for turning on the crowbar circuit is not shorter than the period from the starting time Ts of the first voltage signal V1 to the ending time Te of the second voltage signal V3 in the three-phase voltage signal. The first voltage signal has the smallest phase angle and the second voltage signal has the largest phase angle.

In the present invention, by using the device and method for detecting the crowbar circuit in the wind turbine, the detection module is electrically coupled to the crowbar circuit, and different control signals are sequentially provided to respectively turn on and off the crowbar circuit. When the three-phase voltage signal is provided to the crowbar circuit via the converter, different detection signals outputted by the detection module under on and off states of the crowbar circuit are read, so as to rapidly determine whether the crowbar circuit can be normally thrown into the wind turbine or cut out from the wind turbine. The device and method not only facilitate an operator to remove the failure timely and precisely, but also to minimize the potential damage to the converter due to the crowbar circuit, thereby effectively protecting the core elements of the wind power system.

Although the present invention has been disclosed with reference to the above embodiments, these embodiments are not intended to limit the present invention. It will be apparent to those of skills in the art that various modifications and variations can be made without departing from the spirit or scope of the present invention. Therefore, the scope of the present invention shall be defined by the appended claims.

What is claimed is:

1. A method for detecting a crowbar circuit in a wind turbine, wherein the wind turbine comprises a converter electrically connected to the crowbar circuit, wherein the method comprises:
    electrically coupling a detection module to the crowbar circuit;
    inputting a first control signal into the crowbar circuit, so as to turn on the crowbar circuit;
    providing a three-phase voltage signal to the crowbar circuit via the converter, wherein voltage signals in two adjacent phases has a predetermined phase angle difference;
    reading a first detection signal outputted by the detection module, so as to determine whether the crowbar circuit is thrown into the wind turbine;
    inputting a second control signal to the crowbar circuit, so as to turn off the crowbar circuit; and
    reading a second detection signal outputted by the detection module, to determine whether the crowbar circuit is cut out from the wind turbine.

2. The method of claim 1, wherein the detection module is a current sensor, and the current sensor is connected with the crowbar circuit in series.

3. The method of claim 1, wherein the detection module is a voltage sensor, and the voltage sensor is connected with the crowbar circuit in parallel.

4. The method of claim 1, further comprising:
    receiving the first detection signal and the second detection signal;
    according to the first detection signal received and the second detection signal received, outputting an alarm signal when the crowbar circuit fails to be thrown into or cut out from the wind turbine.

5. The method of claim 1, wherein in the three-phase voltage signal, voltage signals in any two adjacent phases have a phase angle difference of 120 degrees, and the duration of the first control signal is not shorter than the duration corresponding to a period from a starting time of the first voltage signal to an ending time of the second voltage signal in the three-phase voltage signal, wherein the first voltage signal has the smallest phase angle and the second voltage signal has the largest phase angle.

6. A device for detecting a crowbar circuit in a wind turbine, wherein the wind turbine comprises a converter electrically connected to the crowbar circuit, and the device comprises:
    a detection module electrically connected to the crowbar circuit for outputting a detection signal;
    a control module electrically connected to the crowbar circuit for outputting a first control signal and a second control signal, wherein the first control signal is used for turning on the crowbar circuit, and the second control signal is used for turning off the crowbar circuit; and
    an alarm module electrically connected to the detection module for receiving the detection signal and determining whether the crowbar circuit is thrown into the wind turbine or whether the crowbar circuit is cut out from the wind turbine according to the detection signal;
    wherein, the detection signal comprises a first detection signal and a second detection signal, wherein when the control module outputs the first control signal, the first detection signal is used for detecting whether the crowbar circuit is thrown into the wind turbine, and when the control module outputs the second control signal, the second detection signal is used for detecting whether the crowbar circuit is cut out from the wind turbine.

7. The device of claim 6, wherein the detection module is a current sensor, and the current sensor is connected with the crowbar circuit in series.

8. The device of claim 6, wherein the detection module is a voltage sensor, and the voltage sensor is connected with the crowbar circuit in parallel.

9. The device of claim 6, wherein the duration of the first control signal is not shorter than a period from a starting time of the first voltage signal to an ending time of the second voltage signal in the three-phase voltage signal, wherein the first voltage signal has the smallest phase angle, and the second voltage signal has the largest phase angle.

10. A wind power facility comprising a blower and a converter, wherein the converter comprises a first transducer near a side of the blower, and the wind power facility further comprises:
    a crowbar circuit electrically connected to the blower and the first transducer, wherein when power received from the blower via the converter is higher than power outputted to an electrical grid via the converter, the crowbar circuit absorbs excess power from the blower;
    a device for detecting the crowbar circuit in a wind turbine, the device comprising:
        a detection module electrically connected to the crowbar circuit for outputting a detection signal;
        a control module electrically connected to the crowbar circuit for outputting a first control signal and a second control signal, wherein the first control signal is used for turning on the crowbar circuit, and the second control signal is used for turning off the crowbar circuit; and
        an alarm module electrically connected to the detection module for receiving the detection signal and determining whether the crowbar circuit is thrown into the wind turbine or whether the crowbar circuit is cut out from the wind turbine according to the detection signal;

wherein, the detection signal comprises a first detection signal and a second detection signal, wherein when the control module outputs the first control signal, the first detection signal is used for detecting whether the crowbar circuit is thrown into the wind turbine, and when the control module outputs the second control signal, the second detection signal is used for detecting whether the crowbar circuit is cut out from the wind turbine.

11. The wind power facility of claim 10, wherein the detection module is a current sensor, and the current sensor is connected with the crowbar circuit in series.

12. The wind power facility of claim 10, wherein the detection module is a voltage sensor, and the voltage sensor is connected with the crowbar circuit in parallel.

13. The wind power facility of claim 10, wherein the duration of the first control signal is not shorter than a period from a starting time of the first voltage signal to an ending time of the second voltage signal in the three-phase voltage signal, wherein the first voltage signal has the smallest phase angle, and the second voltage signal has the largest phase angle.

* * * * *